United States Patent [19]
Beer et al.

[11] Patent Number: 5,985,180
[45] Date of Patent: Nov. 16, 1999

[54] COATING AGENT FOR PLASTIC FILMS

[75] Inventors: Ekkehard Beer, Bad Schwalbach; Karl-Heinz Kochem, Taunusstein; Michael Schmidt, Oestrich-Winkel, all of Germany

[73] Assignee: Hoechst Aktiengesellschaft, Frankfurt am Main, Germany

[21] Appl. No.: 08/014,136

[22] Filed: Feb. 5, 1993

[30] Foreign Application Priority Data

Feb. 5, 1992 [DE] Germany .............................. 42 03 208

[51] Int. Cl.⁶ ...................................................... H01B 1/20
[52] U.S. Cl. ............................................................ 252/500
[58] Field of Search .................... 252/500, 518, 252/519; 528/422, 373

[56] References Cited

U.S. PATENT DOCUMENTS

| | | | |
|---|---|---|---|
| 4,153,494 | 5/1979 | Oliva | 156/230 |
| 4,153,495 | 5/1979 | Hamisch, Jr. | 156/384 |
| 4,711,742 | 12/1987 | Jen et al. | 252/500 |
| 4,765,928 | 8/1988 | Thakur | 252/500 |
| 4,777,081 | 10/1988 | Crass et al. | 428/215 |
| 4,875,963 | 10/1989 | Paschke et al. | 156/249 |
| 4,904,325 | 2/1990 | Crass et al. | 156/233 |
| 4,912,091 | 3/1990 | Bothe et al. | 428/35.2 |
| 5,093,033 | 3/1992 | Feldhues et al. | 252/500 |
| 5,188,766 | 2/1993 | Eiffler | 252/500 |
| 5,206,297 | 4/1993 | Wernet et al. | 252/500 |
| 5,286,414 | 2/1994 | Kämpf et al. | 252/500 |

FOREIGN PATENT DOCUMENTS

| | | |
|---|---|---|
| 0 208 257 | 1/1987 | European Pat. Off. . |
| 0 257 573 | 3/1988 | European Pat. Off. . |
| 28 56 510 | 7/1979 | Germany . |
| 37 17 668 | 12/1988 | Germany . |
| 1 536 413 | 12/1978 | United Kingdom . |
| 2 006 109 | 5/1979 | United Kingdom . |

OTHER PUBLICATIONS

*Textbook of Polymer Science*, 3rd edition 1984, pp. 401 and 449.

*Polymer Processes* 1956, pp. 329 and 685–686.

*Primary Examiner*—Mark Kopec
*Attorney, Agent, or Firm*—Foley & Lardner

[57] ABSTRACT

A coating agent for plastic films which contains an intrinsically electrically conducting polymer and one or more additives which have an anti-adhesion action with respect to a metal coating to be applied to the plastic film can be used to coat plastic films. The plastic films so coated can be used to transfer a coated metal to another substrate.

26 Claims, No Drawings

COATING AGENT FOR PLASTIC FILMS

BACKGROUND OF THE INVENTION

1. Field of the Invention

The invention relates to a coating agent for plastic films, to plastic films coated with this agent and to the use of the plastic films so coated, in particular in transfer metallization.

2. Description of Related Art

In transfer metallization, thin metal coatings are transferred from a plastic carrier film to a substrate, for example a paper, to be metallized. The procedure followed is usually that a plastic film, for example a polypropylene film or a polyester film, is first coated with a thin metal coating. The metal coating is usually applied by a vacuum metallization technique. After metallization of the plastic carrier film, the latter is brought into contact with the substrate to be metallized, care being taken that the adhesion between the substrate to be metallized and the metal coating is greater than that between the metal coating and the plastic carrier film. This is usually effected by means of an adhesive, which is applied either to the substrate to be metallized or to the metal coating. After bringing substrate and metallized carrier film into contact and, where appropriate, after curing the adhesive, substrate and carrier film are separated again, the metal coating remaining on the substrate. The plastic carrier film can now be metallized again and used for a further transfer metallization process. Depending on the type and nature of the carrier film, this operation can be repeated several times.

Both the transfer metallization process itself and also suitable carrier films have been disclosed and are described in the art, for example, in EP-A-0,175,259, EP-A-0,208,257, EP-A-0,216,342, EP-A-0,266,650, DE-A-2,555,087, DE-A-2,856,510, DE-A-2,907,186, DE-A-2,747,241, and U.S. Pat. No. 4,153,495.

However, these known carrier films have numerous disadvantages. For example, polyester carrier films have such high adhesion to the metal coating, that the surface of this polyester film which is to be metallized must be provided with an adhesion reducing agent such as a release coating, in order to make transfer of the metal coating to another medium possible. In the case of multiple use of this carrier film, the surface to be metallized must be re-coated with the adhesion-reducing agent every time. For reasons associated with the process, this results in irregularities in the release coating in the edge regions of the carrier film and thus in uncontrollable variations in the metal adhesion. For this reason, a carrier film of this type has to be edge-trimmed after each metallization, which leads to ever narrower carrier films and thus ultimately restricts the number of times such a film can be reused. In addition, it is uneconomical for transfer metallization users if the width of the substrate to be metallized has to be adjusted every time to the varying width of the carrier film.

A further disadvantage is seen when the carrier film has double-sided metallization. This is usually the case because generally not only the metal coating to be transferred is applied to the carrier film but, in addition, a second permanent metal coating, which serves to dissipate electrostatic charges which result during the production and in particular during winding of the films, is applied to the rear of the carrier film. (The charge develops only if two different plastics are moved past one another.)

If there is no electrical discharge, so-called Lichtenberg figures appear on the metallized surface in the transfer step. Depending on the intensity of the electrostatic charge present, these may be more than just optical defects. In particular, the adhesion of the coatings to be transferred to the plastic web can also be increased to such an extent that delamination is subsequently no longer possible. This then leads to tearing of the carrier film and possibly damaging to the equipment used in the delamination process.

The use of polyolefin films also gives rise to a limitation in the processing temperature which can be used. As a result, long dwell times accompanied by long drying channels and transverse contraction of the film webs as a result of the tensile forces have to be taken into account if the temperatures during the process are too high for the films.

Furthermore, a carrier material is desired which has a higher resistance during curing of the two-component adhesive in the electron beam process than does the polypropylene most frequently used.

SUMMARY OF THE INVENTION

Accordingly, an object of the present invention is to provide a carrier film useful for transfer metallization applications, which film avoids the above-mentioned disadvantages which are associated with carrier films according to the art. The carrier film should, in particular, have a balanced adhesion to the metal coating, be reusable several times, and prevent the formation of flash figures.

Another object of the present invention is to provide a coating agent which can be used to coat a plastic carrier film, thus providing a carrier film having these desired properties.

Another object of the invention is to provide a process for producing such a carrier film and to provide a process for using such a carrier film, for example, in metal transferring processes.

In accomplishing the foregoing objectives, there has been provided, in accordance with a first object of the present invention, a coating agent for plastic films comprising an intrinsically conductive polymer and one or more additives which have a low adhesion to metals.

In accordance with another aspect of the present invention there has been provided a process for coating a plastic film comprising applying to the film the above described coating agent.

In accordance with another aspect of the present invention there has been provided a metallized plastic film comprising a plastic film to which has been applied the above described coating agent, and wherein a metal coating is applied to the coating agent.

In accordance with another aspect of the present invention there has been provided a method of transferring a metal coating to a substrate comprising the steps of bringing the metallized plastic film described above in contact with a substrate, and then removing the substrate from the plastic film, such that the metal coating remains attached to the substrate, and the coating agent remains attached to the plastic film.

Further objects, features, and advantages of the present invention will become apparent from the detailed description of preferred embodiment that follows.

DETAILED DESCRIPTION OF THE PREFERRED EMBODIMENTS

As the intrinsically electrically conducting polymers of the present invention, any known in the art can be used. For example, polypyrroles, polythiophenes or polyanilines, are known and useful. Polyalkoxythiophenes are, for example, described in DE-A-3,717,668 or in EP-A-0,257,573. In these publications it is mentioned that intrinsically electrically conducting polymers of this type are suitable as antistatic coatings for plastic films. However, when experiments were carried out using films provided with an antistatic coating in this way in a transfer metallization process it was found that transfer of the metal coating to other substrates was possible only with simultaneous loosening of the antistatic coating from the substrate. Alternatively, the adhesion of the antistatic coating to the metal coating and to the coated plastic film was so good that transfer to other substrates was generally not possible. It therefore had to be assumed that plastic films provided with an antistatic finish in this way were not suitable for the transfer metallization process.

Surprisingly, it has now been found that by incorporating an anti-adhesion agent in the coating agent for the plastic films, the adhesion to the metal coating to be applied can be reduced to such an extent that the metal coating can be transferred without any problem, without reducing the adhesion of the antistatic coating to the surface of the plastic film to such an extent that this was also noticeably loosened during the transfer process.

The conducting polymers are used in any suitable amount and generally in an amount of about 5 to about 90% by weight, preferably about 10 to about 50% by weight, with respect to the dry weight of the coating agent. The additive or additives having the anti-adhesion action on the metal coating is contained in the coating agent (with respect to the dry weight of the coating agent) in any suitable amount and generally in an amount of about 1 to about 85% by weight, preferably about 5 to about 75% by weight. obviously, the sum of both constituents never exceeds 100% by weight.

For coating plastic films it is expedient to dissolve, to swell or to disperse the components in one or more appropriate solvent(s) in an appropriate amount. The dry weight of the coating agent is generally about 1 to about 20% by weight, with respect to the weight of the coating agent ready for use.

In order to improve the adhesion of the coating to the surface of the plastic film, it has proved advantageous, in addition to the above-mentioned constituents of the coating agent, to incorporate a binder in the coating agent. However, this is not absolutely essential. Accordingly, the content of the binder, when present, is generally about 1 to about 90% by weight, preferably about 5 to about 75% by weight, with respect to the dry weight of the coating agent. In this case also the sum of all constituents never exceeds 100% by weight.

Suitable plastic carrier films include any known plastics and are generally the films customarily used in the art for transfer metallization, for example polyester films, in particular polyethylene terephthalate films, and films based on α-olefins, such as polypropylene films. These films can be monolayer or multilayer.

The intrinsically electrically conducting polymers used for the coating are, in particular, polypyrroles, like those described in EP-A-0 307 683 or EP-A-0 206 133, polythiophenes and polyanilines, like those described in DE-A-38 34 526. Polyalkoxythiophenes, such as are described in EP-A-0,257,573 (EP-'573), which is hereby incorporated by reference, are preferably used. EP-'573 describes intrinsically electrically conducting polyalkoxythiophenes, preferably oligomers, which are synthesized electrochemically and, in the oxidized form, are completely soluble in dipolar aprotic solvents at room temperature or at about 25° C. and are made up of structural units of the formula (I)

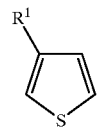

(I)

in which $R^1$: is a $C_1$ to $C_{12}$-, preferably $C_1$ to $C_4$-alkoxy group. The monomer units are linked to one another in the 2-position and/or the 5-position.

In their oxidized form, the electrically conducting polymers contain a corresponding number of anions, preferably anions of the conducting salt which is used in the electrolytic preparation process, in order to compensate for the positive charges on the polymer chain. Examples include: $BF_4^-$, $PF_6^-$, $SbF_6^-$, $SbCl_6^-$, $FeCl_4^-$, $[Fe(CN)_6]^{3-}$ and the like.

The optional binder may be any which will improve the adhesion of the coating to the plastic. Examples of suitable binders which ensure adequate adhesion to diverse plastic films, and in particular to polyester films, and which are chemically inert with respect to the preferred conducting, that is, oxidized, polyalkoxythiophenes, that is to say, for example, do not have an oxidizing or reducing action, are described in DE-A-3,717,668 which is hereby incorporated by reference. Suitable binders include polyvinyl acetal, polyvinyl acetate, polyacrylate, polymaleic anhydride, poly-N-vinylpyrrolidone, polypropylene oxide, cellulose acetate, styrene/acrylonitrile copolymers, polyacrylonitrile, polymethacrylonitrile, polyvinyl chloride, polyvinylidene fluoride, poly-N-vinylcarbazole, poly-N-vinylacetamide, polyacrylic anhydride, polyethylene carbonate, polycarbonate, polymethyl methacrylate, polyethyl methacrylate, polyethylene oxide, polyester, polyethylene, polypropylene, polyolefins, poly-ε-caprolactam, polyurethane, polyvinyl alcohol and any desired copolymers thereof. Polymethyl methacrylate, polyvinyl acetate and polyester and any desired copolymers thereof, like copolyesters of aromatic and/or aliphatic dicarboxylic acids and aromatic and/or aliphatic diols (e.g. polyethyleneisophthalate) are preferred.

Additives according to the invention are those materials which usually have low adhesion to metals, in particular to aluminum. Any additives which have a low adhesion to metal, so that the metal layer can be transferred to the substrate, can be used. Hence, the word "low" means additives which allow the metal layer to be transferred to a desired substrate since they have the requisite low adhesion to metals. These include, preferably, so-called release resins composed of fluorine-containing and/or fluorine-modified polymers, silicone resins, silicone oils, polysiloxanes and also conventional release agents and lubricants, such as, for example, fatty acids and their metal salts, alkylamines, fatty acid esters, fatty acid amides and sulfonates.

A preferred additive is a fluorine-containing polymer having an average particle size of less than about 15 μm. These materials are characterized in that they have—in contrast to materials which have a good adhesion to metal coatings—a low surface tension of generally less than about 30 dyne/cm, preferably less than about 25 dyne/cm.

The coating agent may be prepared by any desired method. Generally, the electrically conducting polymer, in particular the polyalkoxythiophene, is first dissolved or dispersed in a suitable solvent. Suitable solvents are, according to EP-A-0,257,573, for polyalkoxythiophene, dipolar aprotic solvents or solvent mixtures. Examples of such solvents are acetonitrile, N-methylpyrrolidone and N,N-dimethylformamide. In other solvents it may not be possible to dissolve the conducting polymer used, but it may be possible to disperse it. Such solvents include, preferably, acetone, methylene chloride, tetrahydrofuran, ethanol and water. These solvents are also useful. The optional binders and additives additionally used are also preferably dissolved and/or dispersed in the same solvent or in another of the solvents described above.

The two batches (1. dissolved conducting polymer; 2. dissolved binder and additives) are then mixed with one another. This is preferably carried out at a maximum temperature of about 80° C. and in particular at about 20 to about 40° C. The resulting coating agent comprises at least 0.1 g of electrically conducting polymer per 100 ml of solvent.

The plastic films are then coated by means of any known wet film coating methods with subsequent drying, generally by means of hot air and/or heat radiation.

Preferred methods for applying the coating to the plastic film are gravure printing, flexographic printing, smooth-roll application and dipping and spraying methods.

The thickness of the dried coating applied is generally between about 10 nm and about 1 μm, preferably between about 100 and about 300 nm.

If conducting polyalkoxythiophenes are used for the coating, these have an absorption maximum in solution of between 450 and 650 nm. The color of the coating is therefore blue to blue-violet in transmitted light if the other binders and additives used are themselves colorless.

If a polymer film is coated, the surface resistance of the coated polyester film is, depending on the relative proportion of the conducting polymer in the coating and on the coating thickness, generally about $10^5$ to about $10^{11}$ ohm, preferably about $10^6$ to about $10^9$ ohm. The coatings show good adhesion to the plastic film surface and, at the same time, low adhesion to metal coatings applied in vacuum. Repeated removal of metal coatings with the aid of a Tesafilm tape (cross-hatch) is completely successful and without substantial impairment of the coating properties, in particular, without any significant reduction in the surface resistance.

In addition, it is particularly important that the surface resistance of the coating, produced by the intrinsic stability of the electrically conducting polymer, is not dependent on the ambient atmospheric humidity and therefore remains unchanged under high vacuum conditions. The coatings of the present invention have this desired characteristic.

Surprisingly, it was also found that the coating agent according to the invention is also suitable as a coating for embossable films. These films are also frequently used to transfer metal coatings to other substrates.

The invention is illustrated in more detail below with the aid of the following examples.

EXAMPLE 1

0.5 g of electrically conducting polyethoxythiophene (described in EP-A-0,257,573; specific conductivity 1.19 S/cm) and 1.4 g of Dynapol L 206 (soluble copolyester from aromatic dicarboxylic acids and aliphatic diols from Hüls AG) were first dissolved at room temperature in 47.9 g of NMP (N-methylpyrrolidone/solvent having a degree of purity of 99.5%). 0.1 g of Edaplan LA411 (flow agent based on polyorganosiloxanes/polydimethylsiloxane from M ünzing-Chemie GmbH) and 0.1 g of Ceridust 9205F (polytetrafluoroethylene (PTFE) micropowder from Hoechst AG having an average particle diameter of 8 μm, density 2.2 g/cm³) were then added, with continuous stirring.

The batch was then shaken for about 4 hours on a laboratory horizontal shaker at 280 cycles/min.

The batch had a dry weight of 4% for a polyoxythiophene: Dynapol L 206: Ceridust T 9205F ratio of 25:70:5. All solid components, except for the PTFE micropowder, are in solution.

Using this batch, a polyester film (25 μm PET film Hostaphan RN 25 from Hoechst AG, DIN A4) was coated on one side using a 4 μm wire doctor and then dried in a circulating air oven at 120° C. for about 2 min.

The coated film has a surface resistance of $1\times10^6$ ohm (DIN 53482 using flexible tongue electrode).

Aluminum was then vapor-deposited on the coated side of this film in a vacuum metallization apparatus from Leybold AG/Hanau. Prior to vapor deposition, the optical density of the coated polyester film was 0.1 to 0.11 (measured using a transmission densitometer from Getag). As a result of the approximately 0.05 to 0.07 μm thick aluminum coating, the optical density rises to 2.3 to 2.4.

The adhesion of the metal coating to the substrate surface was determined using adhesive tape (in accordance with ASTM D-3359; Tesafilm No. 104, cross-hatch apparatus type GS 30). After stripping off the adhesive strip at a stripping angle of 90°, complete removal of the metal coating on the cross-hatch surface was found. The surface resistance of the coating remaining on the polyester film was determined as $5\times10^6$ ohm after stripping off the metal coating. The optical density was 0.1 to 0.11—as before metallization. The measurement results show that a good adhesion of the antistatic coating to the polyester film which is required for applications in transfer metallization, and, at the same time, an adequate releasing action in respect of the vapor-deposited metal coating were achieved.

EXAMPLE 2

0.3 g of electrically conducting polyethoxythiophene (from Example 1) and 1.7 g of Hostaflon TFB X7200 (soluble fluoropolymer from Hoechst AG) with the addition of 0.1 g of Edaplan LA 411 were dissolved at room temperature in 47.9 g of NMP (4 hours on the horizontal shaker as in Example 1). The dry weight of the solution was 4% for a polyethoxythiophene: Hostaflon TFB X7200 ratio of 15:85.

After coating the polyester film (analogously to Example 1, but at a drying temperature of 150° C. for 2 min. in a circulating air oven), a surface resistance of $2\times10^6$ ohm and an optical density of the coated film of 0.09 to 0.1 were measured. Metallization and adhesion-testing were carried out analogously to Example 1. In the Tesafilm test, a complete removal of the metal coating was achieved; the surface resistance of the antistatic coating after stripping off the metal coating was $5\times10^6$ ohm; the optical density remained constant.

What is claimed is:

1. A coating composition for a transfer metallization plastic film comprising an intrinsically electrically conductive polymer in an amount effective to provide antistatic properties when coated onto the plastic film;

one or more additives which have a low adhesion to a metal layer in an amount effective to allow release of the metal layer from the plastic film;

one or more binders in an amount effective to improve the adhesion of the coating to the surface of the elastic film, wherein the binder is other than the conductive polymer and the additive; and a solvent to dissolve, swell, or disperse the electrically conductive polymer, binder, and the additive.

2. A coating composition as claimed in claim 1, comprising about 5 to about 90% by weight of the intrinsically electrically conducting polymer and about 1 to about 85% by weight of the additive or additives in each case with respect to the dry weight of the coating composition.

3. A coating composition according to claim 1, comprising about 5 to about 90% by weight of the intrinsically electrically conducting polymer, about 1 to about 85% by weight of the additive or additives, and about 1 to about 90% by weight of the binder or binders, in each case with respect to the dry weight of the coating composition.

4. A coating composition as claimed in claim 1, wherein the intrinsically electrically conducting polymer is selected from at least one of the group consisting of a polypyrrole, polythiophene, and polyaniline.

5. A coating composition as claimed in claim 1, wherein the intrinsically electrically conducting polymer is a polyalkoxythiophene.

6. A coating composition as claimed in claim 5, wherein the polyalkoxythiophene comprises repeating units of the formula

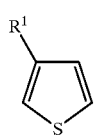

(I)

in which
R$^1$ is a C$_1$–C$_{12}$-alkoxy group and in which the repeating units are linked to one another in the 2- and/or 5-position.

7. A coating composition as claimed in claim 1, wherein the intrinsically electrically conducting polymer is in its oxidized form and has a corresponding number of anions to compensate for the positive charges on the polymer chain, said anions being selected from at least one of the group consisting of BF$_4^-$, PF$_6^-$, SbF$_6^-$, SbCl$_6^-$, FeCl$_4^-$, and (Fe(CN)$_6$)$^{3-}$.

8. A coating composition as claimed in claim 5, wherein the polyalkoxythiophene is in an oxidized form and is completely soluble in a dipolar aprotic solvent at 25° C.

9. A coating composition as claimed in claim 1, wherein at least 0.1 g of the intrinsically electrically conducting polymer is dissolved, swelled, or dispersed in 100 ml of solvent at 25° C.

10. A coating composition as claimed in claim 1, wherein the binder is one or more compounds selected from the group consisting of polyvinyl acetal, polyvinyl acetate, polymaleic anhydride, poly-N-vinylpyrrolidone, poly-4-vinylpyridine, polymethyl methacrylate, polyacrylate, polyethyl methacrylate, polyacrolein, polyformaldehyde, polyethylene oxide, polypropylene oxide, cellulose acetate, styrene/acrylonitrile copolymers, polyacrylonitrile, polymethacrylonitrile, polyvinyl chloride, polyvinylidene fluoride, poly-N-vinylcarbazole, polyvinylacetamide, polyacrylic anhydride, polyethylene carbonate, poly-ϵ-caprolactam, polycarbonate, polyethyl methacrylate, polyester, polyethylene, polypropylene, polyurethane, polyvinyl alcohol, and copolymers formed from the monomers of these polymers.

11. A coating composition as claimed in claim 1, wherein the additive is a selected from at least one of the group consisting of fluorine-containing polymers, silicone oils, fatty acids, metal salts of fatty acids, alkylamines, fatty acid esters, fatty acid amides, and sulfonates.

12. A coating composition as claimed in claim 11, wherein the additive is a fluorine-containing polymer having an average particle diameter of less than about 15 μm.

13. A coating composition as claimed in claim 1, wherein said solvent is selected from the group consisting of one or more of acetonitrile, N-methylpyrrolidone, N,N-dimethylformamide, acetone, methylene chloride, tetrahydrofuran, ethanol, and water.

14. A coating composition as claimed in claim 1, wherein said additive has a surface tension of less than about 30 dyne/cm.

15. A coating composition as claimed in claim 1, comprising about 10 to about 50% by weight of the conductive polymer, with respect to the dry weight of the coating.

16. A coating composition as claimed in claim 1, comprising about 5 to about 75% by weight of the additive, with respect to the dry weight of the coating.

17. A coating composition as claimed in claim 1, comprising about 5 to about 75% by weight of the binder, with respect to the dry weight of the coating.

18. A coating composition as claimed in claim 1, wherein the binder is selected from the group consisting of a polyester, polymethyl methacrylate, and polyvinyl acetate.

19. A coating composition as claimed in claim 14, wherein said surface tension is less than about 25 dynes/cm.

20. A coating composition as claimed in claim 1, wherein the conductive polymer is polyethoxythiophene.

21. A coating composition as claimed in claim 1, wherein the binder is a copolyester.

22. A coating composition as claimed in claim 1, wherein the metal is aluminum.

23. A coating composition as claimed in claim 1, wherein the additive is a release resin selected from the group consisting of silicon resins, and silicone oils.

24. A coating composition as claimed in claim 1, wherein the additive is a release agent selected from the group consisting of fatty acids, metal salts of fatty acids, alkylamines, fatty acid esters, fatty acid amides, and sulfonates.

25. A coating composition as claimed in claim 1, wherein the additive is a fluorine-containing polymer.

26. A coating composition as claimed in claim 1, wherein the additive is a silicone resin.

* * * * *